US006723476B2

(12) United States Patent　　(10) Patent No.: US 6,723,476 B2
Yang　　(45) Date of Patent: Apr. 20, 2004

(54) METHODS OF PATTERNING MATERIALS; AND PHOTOMASKS

(75) Inventor: Baorui Yang, Pflugerville, TX (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/920,971

(22) Filed: Aug. 1, 2001

(65) Prior Publication Data

US 2003/0027056 A1 Feb. 6, 2003

(51) Int. Cl.⁷ .................... G03F 9/00; H01L 21/00; B05D 3/00
(52) U.S. Cl. .................... 430/5; 430/30; 427/256; 438/314; 438/622
(58) Field of Search ............... 430/30, 5; 427/526; 204/192.34; 438/314, 622

(56) References Cited

U.S. PATENT DOCUMENTS

| | | | | |
|---|---|---|---|---|
| 4,620,898 A | * | 11/1986 | Banks et al. ........... | 204/192.34 |
| 4,904,338 A | * | 2/1990 | Kozicki .............. | 216/48 |
| 4,908,226 A | * | 3/1990 | Kubena et al. ......... | 427/526 |
| 5,192,393 A | * | 3/1993 | Muranaka et al. ....... | 427/582 |
| 5,273,849 A | * | 12/1993 | Harriott et al. ........ | 430/5 |
| 5,429,994 A | * | 7/1995 | Ishikawa ............. | 438/676 |
| 5,633,194 A | * | 5/1997 | Selvakumar et al. ..... | 117/103 |
| 2002/0154187 A1 | | 10/2002 | Wong et al. | |

FOREIGN PATENT DOCUMENTS

WO　　WO 01/25855　　 * 4/2001

OTHER PUBLICATIONS

D.M.Mattox, "Ion Plating", in Handbook of Plasma Processing Technology, Rossnagel et al. Eds.; Noyes,(NY), 1990, p.338–355.*
Wolf, S. et al., "Silicon Processing for the VLSI Era", vol. 1, pp. 476–480.
Micrion Corporation, "Products & Technology, 8000 Series", printed from Micrion Website Jun. 5, 2001, 4 pgs.

* cited by examiner

Primary Examiner—Mark F. Huff
Assistant Examiner—Kripa Sagar
(74) Attorney, Agent, or Firm—Wells St. John P.S.

(57) ABSTRACT

The invention includes a method of patterning a mass of material. A beam of activated particles is formed proximate the mass of material, and a pattern of deposit is formed on a surface of the mass with the beam of activated particles. The mass is then etched while using the deposit as an etch mask. The mass of material can be associated with a radiation-patterning tool, such as, for example, a photomask, or can be associated with a semiconductor substrate. The invention also encompasses a photomask construction comprising a substrate, and a patterned material over the substrate. The patterned material covers some regions of the substrate, and leaves other regions not covered. A carbon-containing layer is on the patterned material, but not over the regions of the substrate that are not covered by the patterned material.

55 Claims, 5 Drawing Sheets

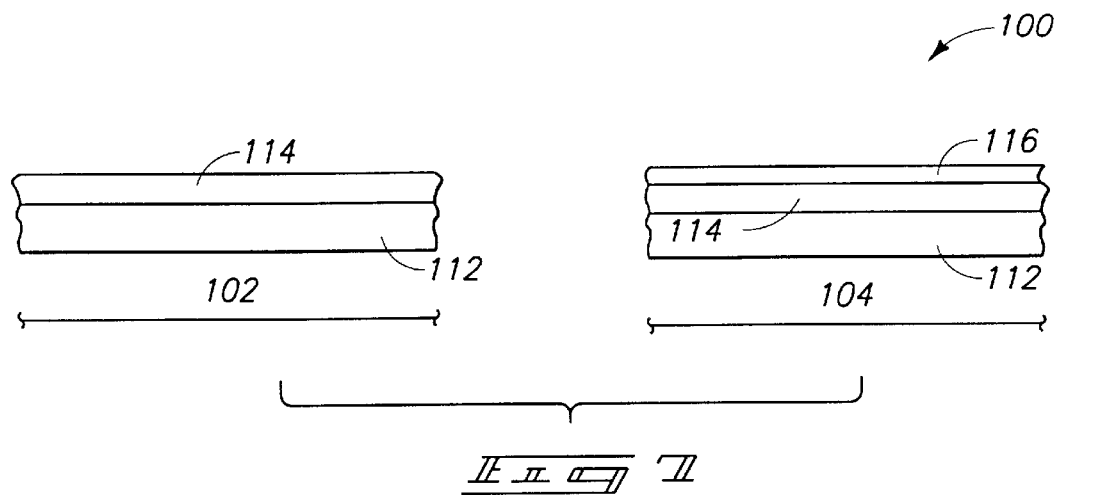
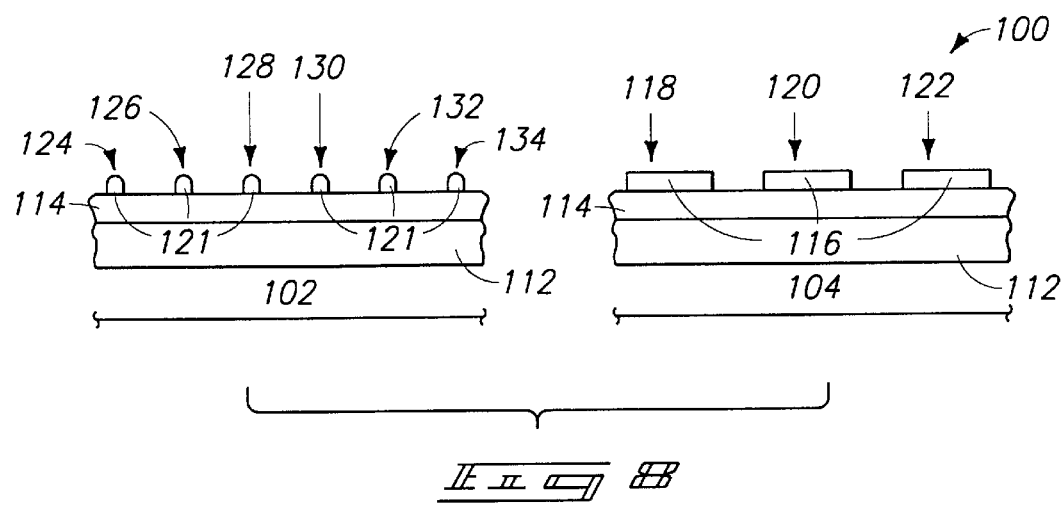
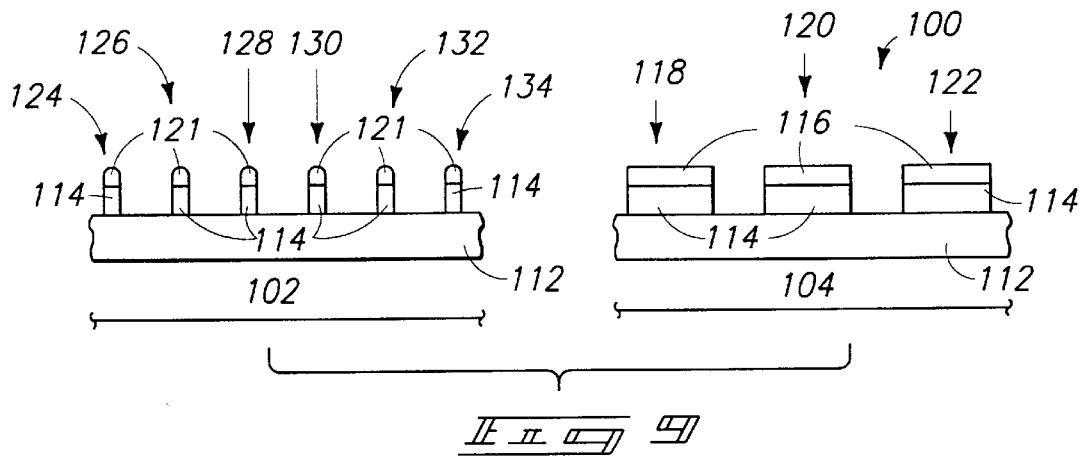

METHODS OF PATTERNING MATERIALS; AND PHOTOMASKS

TECHNICAL FIELD

The invention pertains to methods of patterning materials, such as, for example, methods of patterning layers associated with photomasks, and methods of patterning layers associated with semiconductor substrates. The invention also pertains to photomask constructions.

BACKGROUND OF THE INVENTION

Photolithography is commonly used during formation of integrated circuits on semiconductor wafers. More specifically, a form of radiant energy (such as, for example, ultraviolet light) is passed through a radiation-patterning tool and onto a semiconductor wafer. The radiation-patterning tool can be, for example, a photomask or a reticle, with the term "photomask" being sometimes understood to refer to masks which define a pattern for an entirety of a wafer, and the term "reticle" being sometimes understood to refer to a patterning tool which defines a pattern for only a portion of a wafer. However, the terms "photomask" (or more generally "mask") and "reticle" are frequently used interchangeably in modern parlance, so that either term can refer to a radiation-patterning tool that encompasses either a portion or an entirety of a wafer. For purposes of interpreting the claims that follow, the term "photomask" will be utilized to encompass both radiation-patterning tools that define a pattern for an entirety of a wafer (i.e., the tools traditionally referred to as masks), and radiation-patterning tools that define a pattern for only a portion of a wafer (i.e., the tools traditionally referred to as reticles).

Radiation-patterning tools contain light restrictive regions (for example, totally opaque or attenuated/half-toned regions) and light transmissive regions (for example, totally transparent regions) formed in a desired pattern. A grating pattern, for example, can be used to define parallel-spaced conductive lines on a semiconductor wafer. The wafer is provided with a layer of photosensitive resist material commonly referred to as photoresist. Radiation passes through the radiation-patterning tool onto the layer of photoresist and transfers the mask pattern to the photoresist. The photoresist is then developed to remove either the exposed portions of photoresist for a positive photoresist or the unexposed portions of the photoresist for a negative photoresist. The remaining patterned photoresist can then be used as a mask on the wafer during a subsequent semiconductor fabrication step, such as, for example, ion implantation or etching relative to materials on the wafer proximate the photoresist.

Advances in semiconductor integrated circuit performance have typically been accompanied by a simultaneous decrease in integrated circuit device dimensions and a decrease in the dimensions of conductor elements which connect those integrated circuit devices. The demand for ever smaller integrated circuit devices brings with it demands for ever-decreasing dimensions of structural elements on radiation-patterning tools, and ever-increasing requirements for precision and accuracy in radiation-patterning with the tools.

It would be desirable to develop improved methods for forming decreased circuit device dimensions for integrated circuit devices, and to develop improved methods for forming radiation-patterning tools.

SUMMARY OF THE INVENTION

In one aspect, the invention encompasses a method of patterning a mass of material. A beam of activated particles is formed proximate a surface of the mass of material, and a deposit is formed on the surface with the beam of activated particles. The beam is displaced relative to the mass to form a pattern of the deposit across the surface of the mass. The mass is then etched while using the deposit as an etch mask. In particular aspects of the invention, the mass of material can be associated with a radiation-patterning tool, such as, for example, a photomask. In other aspects of the invention, the mass of material can be associated with a semiconductor substrate.

The invention also encompasses a photomask construction comprising a substrate, and a patterned material over the substrate. The patterned material covers some regions of the substrate, and leaves other regions not covered. A layer is on the patterned material, but not over the regions of the substrate that are not covered by the patterned material. The layer comprises carbon as a majority component.

BRIEF DESCRIPTION OF THE DRAWINGS

Preferred embodiments of the invention are described below with reference to the following accompanying drawings.

FIG. 7 is a diagrammatic, cross-sectional, fragmentary view of a pair of fragments of a semiconductor construction being treated in accordance with methodology encompassed by the present invention.

FIG. 8 is view of the FIG. 7 fragments shown at a processing step subsequent to that of FIG. 7.

FIG. 9 is a view of the FIG. 7 fragments shown at a processing step subsequent to that of FIG. 8.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 1:
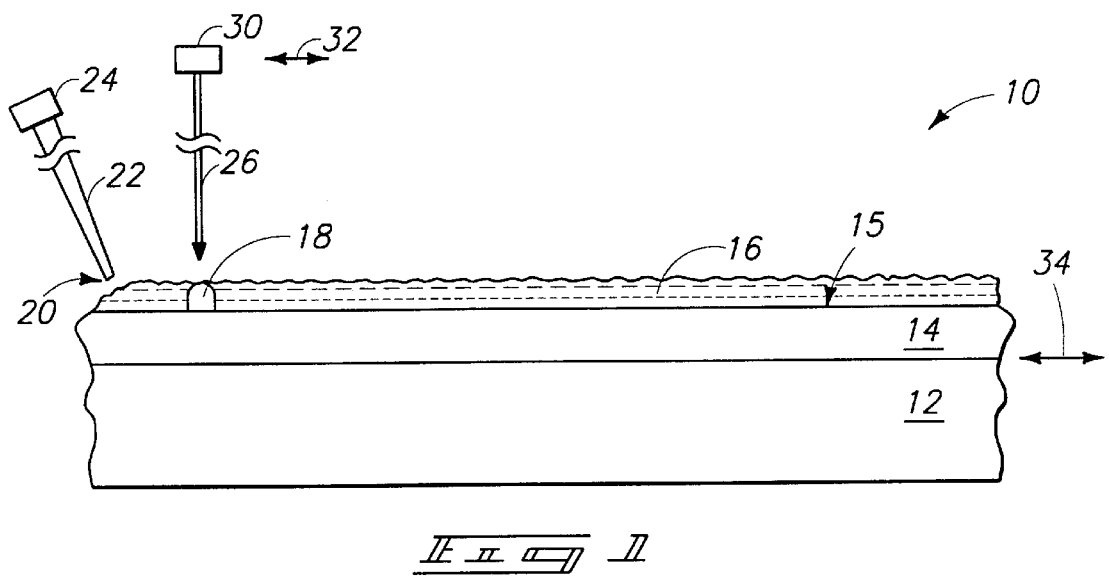
FIG. 1 is a diagrammatic cross-sectional view of a fragment of a semiconductor assembly being treated in accordance with a method of the present invention.

The invention encompasses a recognition that fine and accurate patterns can be formed on various substrates if a beam of activated particles is utilized to form the pattern. FIG. 1 illustrates an exemplary method in which a beam of activated particles can be utilized for forming a pattern over a substrate. More specifically, FIG. 1 illustrates a fragment 10 being processed in accordance with an exemplary method of the present invention. Fragment 10 comprises a substrate 12 having a mass 14 thereover.

Substrate 12 can comprise, for example, a semiconductive material, such as, for example, monocrystalline silicon. To aid in interpretation of the claims that follow, the terms "semiconductive substrate" and "semiconductor substrate" are defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

Mass 14 can comprise, for example, an electrically insulative material, such as, silicon nitride, silicon dioxide, or borophosphosilicate glass (BPSG) formed over semiconductor substrate 12. Alternatively, mass 14 can comprise a semiconductive material, such as, for example, polycrystalline silicon or amorphous silicon formed over substrate 12. In yet other alternative embodiments, mass 14 can comprise an electrically conductive material, such as, for example, an elemental metal, a metal alloy, a metal silicide, or a metal nitride. Mass 14 comprises an upper surface 15.

In the above-described embodiments, substrate 12 and mass 14 are part of a semiconductor assembly. In other embodiments, substrate 12 and mass 14 can be part of a radiation-patterning tool, such as, for example, a photomask. Methodology of the present invention can be utilized for forming either a dark field radiation-patterning tool or a clear-field radiation-patterning tool.

In embodiments in which methodology of the present invention is utilized to form a photomask, substrate 12 can comprise a glass, such as, for example, a soda-lime glass, a borosilicate glass or quartz; and mass 14 can comprise chromium. Further, a thin layer of antireflective material (such as, for example, a layer of chromium oxide, $Cr_2O_3$) (not shown) can be formed over a surface of mass 14. It is noted that the utilization of chromium-containing material for mass 14 and glass for substrate 12 is but one of several combinations that can be utilized in forming a radiation-patterning tool. Generally, the combinations will utilize a substrate 12 which is relatively transparent to radiation, and a mass 14 over the substrate which is relatively opaque to radiation.

FIG. 1 illustrates methodology of the present invention which can be utilized for forming a patterned mask over mass 14. Specifically, a fluid 16 is flowed across an upper surface of mass 14. The fluid can be in the form of either a gas or a liquid, but would typically be in the form of a gas. Fluid 16 comprises a precursor material which is ultimately to be utilized for forming a deposit 18 in specific locations over mass 14. The precursor can comprise, consist essentially of, or consist of materials consisting of hydrogen and carbon; such as, for example, a saturated hydrocarbon material, or an unsaturated hydrocarbon material. In particular embodiments, the precursor 16 will comprise an unsaturated hydrocarbon material which includes aromatic rings.

Fluid precursor material 16 is flowed from a nozzle opening 20 which in turn is connected through tubing 22 to a source 24 of the precursor material.

A beam 26 of activated particles is generated from a source 30. Beam 26 impacts precursor material 16 to cause formation of a deposit 18 from the precursor material. The activated particles utilized in beam 26 can comprise, consist essentially of, or consist of gallium ions; or alternatively can comprise, consist essentially of, or consist of carbon ions.

In embodiments in which precursor material 16 comprises hydrocarbon materials, deposit 18 can comprise carbon. In particular embodiments, deposit 18 will comprise at least 90 atom percent carbon, and can comprise, for example, at least 95 atom percent carbon. Further, in embodiments which the activated particles comprise gallium ions, deposit 18 can comprise gallium. Accordingly, in embodiments in which beam 26 comprises gallium ions and precursor 16 comprises hydrocarbon, deposit 18 can comprise, consist essentially of, or consist of a mixture of gallium and carbon. In alternative embodiments in which beam 26 consists of or consists essentially of carbon ions and precursor 16 comprises hydrocarbon, deposit 18 can consist of or consist essentially of carbon.

Beam 26 is displaced relative to fragment 10 to form deposit 18 as a pattern across upper surface 15 of mass 14. Such displacement can comprise movement of beam 26 relative to fragment 10 (illustrated by an axis 32); movement of fragment 10 relative to beam 26 (illustrated by an axis 34); or movement of both beam 26 and fragment 10 relative to each other. Although each of the axes 32 and 34 is shown illustrating horizontal movement within the plain of the page, it is to be understood that the movement can occur along numerous other axes (not shown), including rotational axes and axes orthogonal to those shown.

The beam 26 is preferably retained within a vacuum from source 30 to the location where beam 26 impacts fluid 16. Accordingly, at least some of fragment 10 is preferably within a vacuum during treatment with the methodology of FIG. 1. A suitable device which can be utilized for accomplishing the methodology of FIG. 1 is a device marketed by Seiko™ as the SIR-3000™ apparatus. Another suitable device is the device marketed by Micrion™ as the Micrion-8000 FIB™ system. Both of the above-described devices can be utilized after suitable modifications which will be recognized by persons of ordinary skill in the art. The Seiko SIR-3000™ system can be utilized in methodology of the present invention with a 20 kilovolt focused $Ga^+$ ion beam, a probe current set at 45 pico-A, and a beam spot size set around 0.2 micron. An edge placement accuracy of the system is found to be ±60 nanometers in three sigma.

Figure 2:
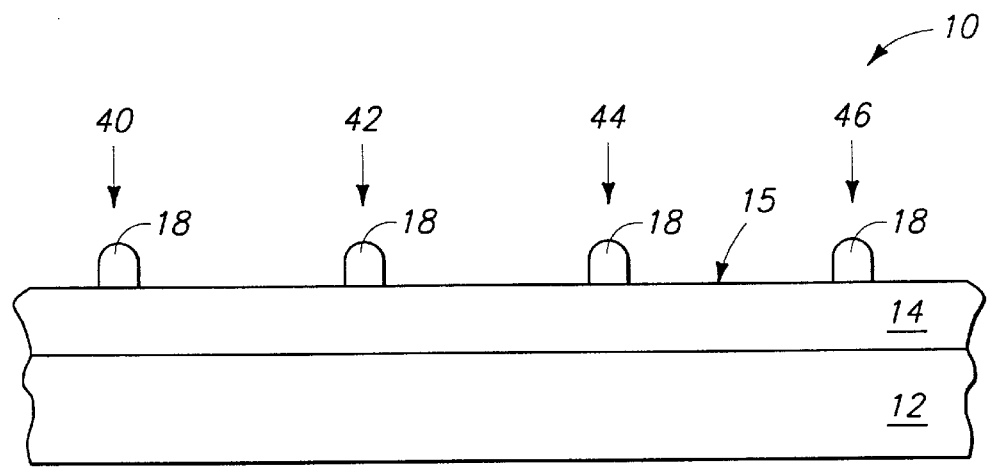
FIG. 2 is a view of the FIG. 1 fragment shown at a processing step subsequent to that of FIG. 1.

Referring to FIG. 2, fragment 10 is illustrated after a pattern of deposit material 18 is formed across upper surface 15 of mass 14. The illustrated pattern comprises four discrete lumps (40, 42, 44 and 46) of material 18. The height of such lumps can be adjusted by adjusting the duration for which beam 26 (FIG. 1) is over any particular location and/or by adjusting the number of passes of beam 26 over a particular location. In the shown embodiment, each of lumps 40, 42, 44 and 46 has approximately the same height as one another, but it is to be understood that the invention encompasses other embodiments (not shown) wherein the lumps 40, 42, 44 and 46 have different heights relative to one another.

Figure 3:
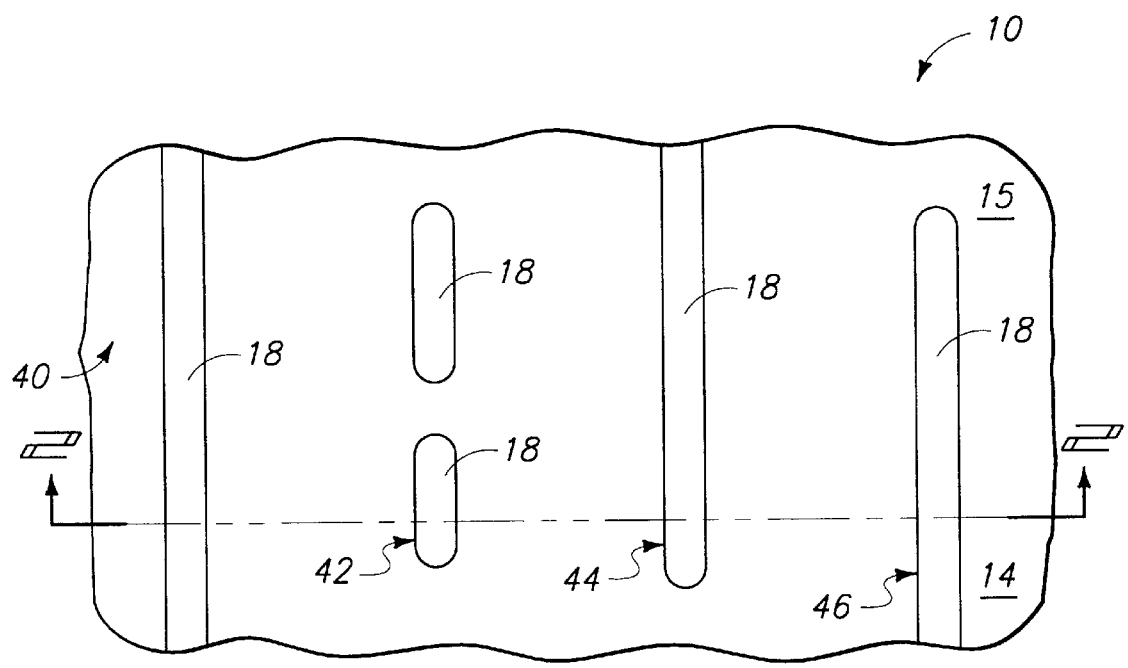
FIG. 3 is a top view of the FIG. 2 fragment.

FIG. 3 illustrates a top view of fragment 10, and shows that each of lumps 40, 42, 44 and 46 can comprise part of a pattern defined by deposited material 18 over mass 14.

Figure 4:
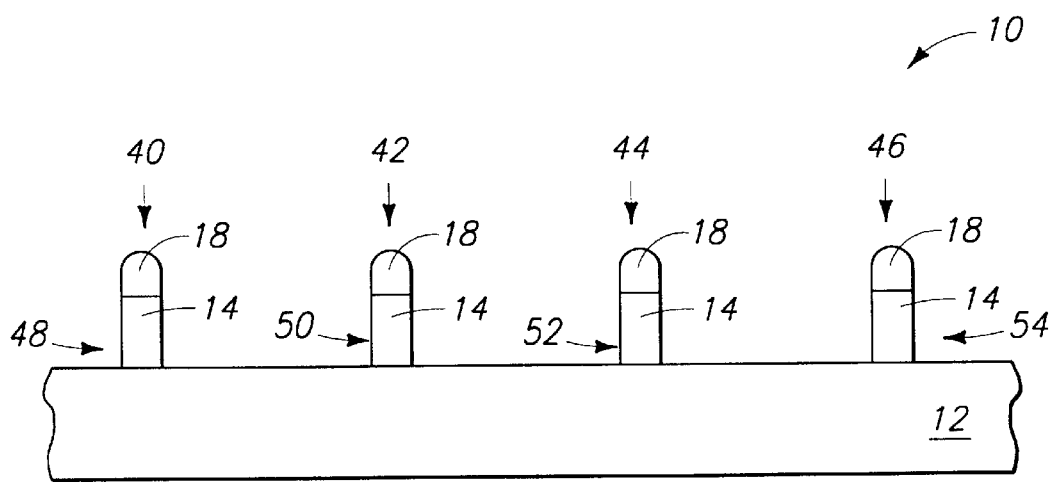
FIG. 4 is a view of the FIG. 2 fragment, shown in the cross-sectional view of FIG. 2, and shown at a processing step subsequent to that of FIG. 2.

Referring to FIG. 4, fragment 10 is shown in the cross-sectional view of FIG. 2, and at a processing step subsequent to that of FIG. 2. Specifically, fragment 10 is shown after mass 14 has been subjected to an etch while utilizing deposited material 18 as an etch mask. The etch has formed pedestals 48, 50, 52 and 54 of material 14. In the shown embodiment, an entirety of material 14 has been removed from between the pedestals. However, it is to be understood that the invention encompasses other embodiments (not shown) wherein only some of the material 14 is removed from between the locations masked by deposit 18.

A suitable etch for removing material 14 can be an etch which is selective for material 14 relative to deposit 18. In other words, a suitable etch can be an etch which removes material 14 faster than removal of material 18. In particular embodiments, the etch can be highly selective in that it does not remove any of deposit 18 during the removal of material 14. In other embodiments, the etch can be less selective, and can remove some of deposit 18 during removal of material 14. In yet other embodiments, the etch can be substantially non-selective, and can remove material 18 at about the same rate as removal of material 14, or can even remove material 18 faster than removal of material 14. In embodiments in which the etch is substantially non-selective, there will preferably be a thick enough layer of deposit 18 formed over material 14 to compensate for the loss of deposit 18 during the etching of material 14.

In embodiments in which material 14 comprises chromium and deposit 18 comprises carbon, a suitable etch of material 14 can be accomplished by a wet etch utilizing the material marketed as CR-7S™ by CYANTEK™. Alternatively, a suitable etch can be a dry etch of the chromium-containing material.

In embodiments in which material 14 is an electrically insulative, electrically conductive, or semiconductive material utilized in semiconductor device fabrication, and in which material 18 comprises carbon, suitable etching of material 14 can be accomplished by either wet or dry etching of the material.

If fragment 10 is ultimately to be utilized as a photomask, deposit 18 can be left over pedestals 48, 50, 52 and 54 as an anti-reflective material. Specifically, if material 14 comprises chrome and substrate 12 comprises glass, there would typically be an anti-reflective material provided over the chrome (with an exemplary anti-reflective material being chromium oxide) during fabrication of a photomask. In particular embodiments of the present invention, such anti-reflective material can be omitted, and instead deposit 18 can be utilized as anti-reflective material. It is found that if deposit 18 comprises carbon and is formed to a thickness of from about 2 nanometers to about 30 nanometers, such can have suitable properties to at least partially block light transmittance. For instance, it is found that if deposit 18 is formed utilizing five beam scans over a chromium material, the relatively thin layer of deposited material 18 will offer less protection to the underlying Cr, and will allow from about 11 to about 12 percent transmission of light having a wavelength of 248 nanometers after the Cr is etched. However, if deposit 18 is formed by twenty beam scans, the thicker layer of deposited material will offer substantially complete protection to the underlying Cr, and will allow less than about 0.2 percent transmission of the light having a wavelength of 248 nanometers through the Cr after etching. Accordingly, if deposit 18 comprises carbon retained over the chromium-containing pedestals of a photomask, such deposit can remain over the pedestals during subsequent photolithographic processing with the photomask.

Figure 5:
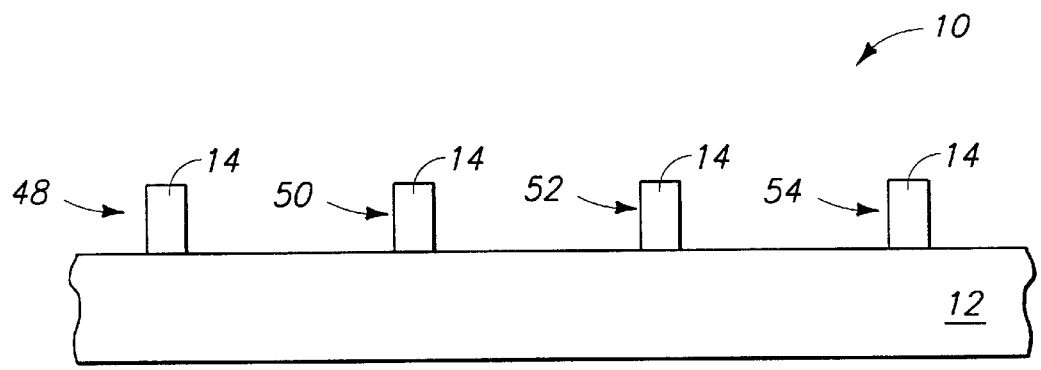
FIG. 5 is a view of the FIG. 2 fragment shown at a processing step subsequent to that of FIG. 4.

In embodiments in which pedestals 14 are ultimately to be utilized for forming semiconductor devices, or in particular embodiments in which pedestals 14 are to be incorporated into photomask structures, it can be desirable to remove deposit 18 from over the pedestals. Such removal is illustrated in FIG. 5, wherein pedestals 48, 50, 52 and 54 are illustrated after material 18 (FIG. 4) has been removed. In embodiments in which material 18 comprises carbon, such removal can be accomplished by, for example, an oxygen plasma etch.

The methodology described with reference to FIGS. 1–5 can form very fine features. For instance, the deposited lumps, 40, 42, 44 and 46 (FIG. 2) can be formed with widths of from about 5 nanometers to about 40 nanometers, with such widths being limited by beam technologies, and with the widths being expected to narrow as technologies are developed for forming narrower beams. The widths of lumps 40, 42, 44 and 46 can be transferred to material 14 to form pedestals 48, 50, 52 and 54 (FIG. 4) having about the same widths.

Figure 6:
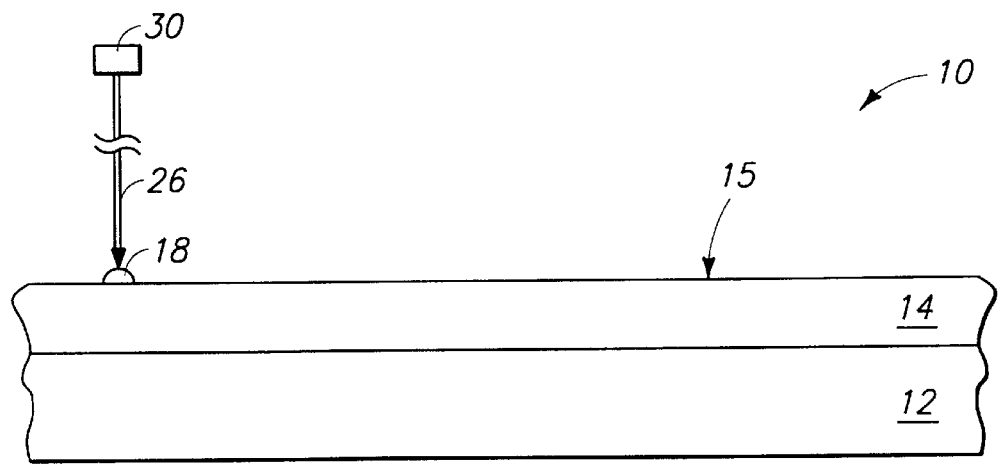
FIG. 6 is a view of a fragment of a semiconductor assembly being treated in accordance with a second embodiment method of the present invention.

FIG. 6 illustrates a second embodiment method of the present invention. In referring to FIG. 6, similar numbering will be used as was used above in describing FIG. 1. FIG. 6 illustrates fragment 10 at a processing step similar to that of FIG. 1, but shows that precursor 16 (FIG. 1) is omitted, and instead beam 26 impacts surface 15 of mass 14 to form deposit 18. In the embodiment FIG. 6, deposit 18 can be formed by deactivation of activated particles from beam 26 as the particles impact either surface 15, or a growing surface of deposit 18. For instance, if beam 26 comprises activated gallium particles, such particles can deactivate upon impact with a surface to form a growing gallium deposit 18. In particular embodiments, beam 26 will comprise, consist essentially of, or consist of activated carbon particles, and accordingly deposit 18 will comprise, consist essentially of, or consist of carbon formed from deactivation of the activated carbon particles.

Beam 26 can be displaced relative to fragment 10 by moving one or both of beam 26 and fragment 10 relative to the other of beam 26 and fragment 10 similarly to the displacement described above with reference to FIG. 1.

In the embodiment of FIG. 6, deposit 18 can consist essentially of deactivated particles from beam 26. Alternatively, the particles can react with material of mass 14 so that deposit 18 comprises reaction products formed from the interaction of particles from beam 26 with the material of mass 14. If beam 26 comprises activated carbon particles, the deposit 18 can predominately comprise carbon from beam 26. In either of the embodiments of FIGS. 1–5 or FIG. 6, deposit 18 can comprise carbon as a majority component (i.e. can comprise a higher atomic percent of carbon than any other element). The carbon can be in elemental form.

Another embodiment of the invention is described with reference to FIGS. 7–10. Referring initially to FIG. 7, a semiconductor construction 100 is shown in fragmentary view. Specifically, semiconductor construction 100 is illustrated to comprise a first fragment 102 and a second fragment 104. Fragment 102 can be considered as a first defined region and fragment 104 can be considered as a second defined region.

Semiconductor construction 100 comprises a substrate 112 and a mass 114 over substrate 112. Substrate 112 can comprise, for example, monocrystalline silicon; and mass 114 can comprise an electrically insulative material, an electrically conductive material, or a semiconductive material. Ultimately, mass 114 is to be patterned, with the pattern within region 102 having a higher density of device features than the pattern within region 104.

One aspect of the present invention is a recognition that photolithographic processing can have an advantage relative to the processing described with reference to FIGS. 1–6 (specifically the embodiment of FIG. 1 or FIG. 6, together with the methodology of FIGS. 2–5) in terms of the speed with which a pattern can be formed. Photolithographic processing can be utilized to rapidly form a pattern over a large portion of semiconductor real estate in that the entirety of a pattern can be simultaneously formed by one exposure to radiation. In contrast, the processing of FIGS. 1–6 forms a pattern by sequential exposure of the regions of the pattern to a beam of radiation. However, the processing of FIGS. 1–6 can have an advantage relative to photolithographic processing in that it can form a pattern with higher resolution (i.e., tighter spacing between patterned components) than can photolithographic processing.

The methodology of FIGS. 7–10 utilizes photolithographic processing over a portion of a wafer, and utilizes the processing of FIGS. 1–6 over another portion of a wafer to incorporate advantages of both photolithographic processing and the processing of FIGS. 1–6 into semiconductor device fabrication. The region 104 is utilized for photolithographic processing, and the region 102 is utilized for the processing of FIGS. 1–6. Region 104 is shown having a layer of photoresist 116 formed over mass 114.

Referring to FIG. 8, semiconductor construction 100 is illustrated after photoresist mass 116 is patterned by photolithographic processing to form a series of patterned resist blocks 118, 120 and 122 over mass 114.

Also shown in FIG. 8, a series of deposits 124, 126, 128, 130, 132 and 134 are formed over mass 114 of region 102. Deposits 124, 126, 128, 130, 132 and 134 can be formed by either the methodology described with reference to FIG. 1, or the methodology described with reference to FIG. 6. The deposits formed over region 102 can be formed before or after the patterning of photoresist 116, and in particular embodiments can be formed even before provision of the photoresist 116 over mass 114 (although in the shown embodiment, the deposits have been formed after provision of the photoresist over mass 114). The deposits comprise a material 121 which can, for example, comprise, consist essentially of, or consist of carbon.

Referring to FIG. 9, semiconductor construction 100 is shown after exposure of material 114 to an etch while utilizing photoresist 116 and deposited material 121 as a mask. Although in the shown embodiment the etching of material 114 in regions 102 and 104 is illustrated to occur simultaneously, it is to be understood that the invention encompasses other embodiments (not shown) wherein the etching of material 114 in region 102 occurs sequentially (either before or after) relative to the etching of material 114 in region 104. For instance, the etching of material 114 in region 102 can be accomplished before or after provision of photoresist 116 over mass 114, before or after patterning of photoresist 116, and alternatively before or after etching of material 114 in region 104.

It can be preferred, however, that the etching of material 114 in regions 102 and 104 be conducted simultaneously. In such embodiments, the etch of material 114 preferably comprises an etch chemistry which is selective for material 114 relative to the masking materials 116 and 121.

Figure 10:
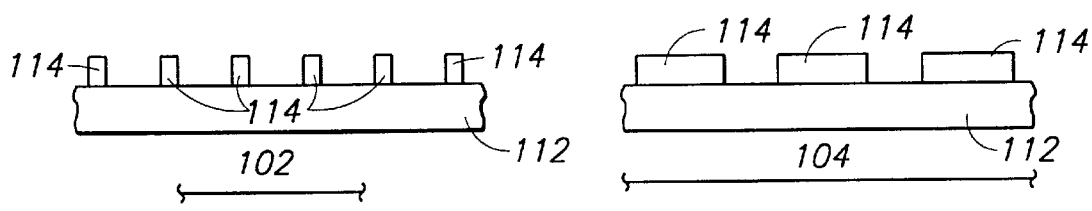
FIG. 10 is a view of the FIG. 7 fragments shown at a processing step subsequent to that of FIG. 9.

Referring to FIG. 10, masking materials 116 and 121 (FIG. 9) are removed to leave patterned components of mass 114 over regions 102 and 104. It is noted that the patterned components over region 102 are formed to a higher resolution (are smaller) than the patterned components over region 104 due to the higher resolution achievable by the methodology of FIGS. 1–6 relative to that achievable by photolithographic processing.

In the shown embodiment, the photolithographic processing is applied only to region 104, and the processing of FIGS. 1–6 is applied only to region 102. However, it is to be understood that the invention encompasses other embodiments (not shown) wherein the photolithographic processing and the processing of FIGS. 1–6 are utilized for forming overlapping features of a semiconductor construction (i.e., are applied to a common region).

It will be recognized that one aspect of the present invention is that a pattern is directly written onto a semiconductor construction, in contrast to photolithographic processing wherein a pattern is first written onto a photomask and subsequently transferred to a semiconductor construction. Methodologies have previously been developed for directly writing a pattern onto a semiconductor construction (such as, for example, ion beam or electron beam methodologies). However, such methodologies have utilized processing wherein a layer of photoresist is provided over a semiconductor wafer, and subsequently a pattern is etched into the photoresist utilizing either an electron beam or a ion beam. A problem with such methodologies is that the insulative material of the photoresist does not effectively dissipate an accumulated charge from an electron beam or an ion beam. Accordingly, a static charge can develop at localized regions within the photoresist, and such static charge can cause deflection of the electron beam or ion beam to ultimately cause errors in a pattern formed in the photoresist. Methodology of the present invention can avoid such problems in that the present invention can form a pattern over a conductive material, which can dissipate charges generated by activated particles utilized in generating the pattern. Problems associated with ion beam and/or electron beam dissipation have also been encountered in prior methods of patterning photomasks, and the present invention can avoid such problems in the formation of photomasks by forming a patterned deposit in physical contact with a conductive material, such as, for example, in physical contact with a chromium-containing material.

The present invention can avoid some of the difficult issues associated with previous resist processes, including, for example, problems associated with resist sensitivity, resist image quality, defects caused by resist developing, and resist to substrate selectivity.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A method of patterning an opaque material of a photomask, comprising:

forming a beam of activated particles proximate an opaque material;

utilizing the beam of activated particles to deposit a material in a pattern over the opaque material; and etching the opaque material while using the deposited material as an etch mask to transfer the pattern from the deposited material to the opaque material.

2. The method of claim 1 wherein the deposited material predominantly comprises deactivated particles from the beam.

3. The method of claim 1 wherein the beam of activated particles impacts a fluid precursor to release a component from the precursor, and wherein the deposited material predominantly comprises the released component.

4. The method of claim 1 wherein the opaque material comprises chromium, and wherein the deposited material is formed in physical contact with the opaque material.

5. The method of claim 1 wherein the deposited material is the only masking material over the opaque material during the etch.

6. The method of claim 1 wherein the deposited material consists essentially of carbon.

7. The method of claim 1 wherein the deposited material consists essentially of carbon and gallium.

8. A method of patterning a mass of material, comprising:
   forming a beam of activated particles proximate the mass of material and forming a deposit on a surface of the mass with the beam of activated particles;
   displacing the beam relative to the mass to form a pattern of the deposit across the surface of the mass; and
   etching the mass while using the deposit as an etch mask.

9. The method of claim 8 wherein the activated particles impact the surface of the mass and then deactivate to form at least some of the deposit.

10. The method of claim 9 wherein the deposit consists essentially of the deactivated particles.

11. The method of claim 8 wherein the displacing the beam comprises moving the beam relative to the mass.

12. The method of claim 8 wherein the displacing the beam comprises moving the mass relative to the beam and not moving the beam.

13. The method of claim 8 wherein the displacing the beam comprises moving the mass relative to the beam and moving the beam relative to the mass.

14. The method of claim 8 further comprising flowing a precursor of the deposit across the mass and exposing the precursor to the activated particles; the forming the deposit comprising impacting the precursor with the activated particles to cause formation of the deposit from the precursor.

15. The method of claim 14 wherein the precursor consists of hydrogen and carbon; and wherein the activated particles consist essentially of gallium ions.

16. The method of claim 8 wherein the mass comprises chromium, and wherein the patterned mass forms at least a portion of a photomask.

17. The method of claim 8 wherein the mass is over a monocrystalline silicon substrate.

18. The method of claim 8 wherein the mass is over a semiconductive substrate.

19. A method of forming a pattern on a photomask, comprising:
   providing a photomask substrate having a first material thereover;
   forming a beam of activated particles proximate the first material;
   forming a second material with the beam of activated particles;
   displacing the beam relative to the first material to form a pattern of the second material across the first material; and
   etching the first material while using the second material as a mask.

20. The method of claim 19 wherein the activated particles comprise activated carbon particles, and wherein the second material predominately comprises carbon from the activated carbon particles.

21. The method of claim 19 further comprising flowing a precursor of the second material across the first material and exposing the precursor to the activated particles; the forming the second material comprising impacting the precursor with the activated particles to cause the second material to be deposited from the precursor.

22. The method of claim 21 wherein the precursor comprises a material consisting of hydrogen and carbon.

23. The method of claim 21 wherein the precursor comprises a material consisting of hydrogen and carbon; and wherein the activated particles consist essentially of gallium ions.

24. The method of claim 19 wherein the first material comprises chromium.

25. The method of claim 19 wherein the first material comprises chromium and the second material comprises carbon.

26. The method of claim 19 further comprising utilizing the photomask to pattern a beam of light during photolithographic processing; and wherein the second material is removed from over first material prior to the photolithographic processing.

27. The method of claim 19 further comprising utilizing the photomask to pattern a beam of light during photolithographic processing; and wherein the second material remains over first material during the photolithographic processing.

28. The method of claim 19 further comprising utilizing the photomask to pattern a beam of light during photolithographic processing; wherein the second material remains over first material during the photolithographic processing; and wherein the first material comprises chromium and the second material comprises carbon.

29. The method of claim 19 wherein the etching of the first material utilizes an etch which etches the first material more rapidly than any etching of the second material.

30. The method of claim 19 wherein the first material comprises chromium and the second material comprises carbon; and wherein the etching of the first material utilizes a wet etch which etches the first material more rapidly than any etching of the second material.

31. The method of claim 19 wherein the first material comprises chromium and the second material comprises carbon; and wherein the etching of the first material utilizes a dry etch.

32. A method of forming a pattern on a photomask, comprising:
   providing a photomask substrate having a first material thereover;
   flowing a gas-phase precursor across the substrate;
   displacing a beam of activated particles relative to the substrate; the activated particles impacting the gas-phase precursor; the impacted precursor forming a second material which deposits in a pattern over the first material; and
   etching the first material while using the second material as an etch mask.

33. The method of claim 32 wherein the first material comprises chromium.

34. The method of claim 32 wherein the first material comprises chromium and the second material comprises carbon.

35. The method of claim 32 wherein the precursor comprises hydrogen and carbon.

36. The method of claim 32 wherein the precursor comprises a material consisting of hydrogen and carbon.

37. The method of claim 32 wherein the activated particles consist essentially of ions.

38. The method of claim 32 wherein the activated particles consist essentially of gallium ions.

39. The method of claim 32 wherein the precursor comprises a material consisting of hydrogen and carbon; and wherein the activated particles consist essentially of gallium ions.

40. A method of forming a patterned material on a semiconductor substrate, comprising:

providing a semiconductor substrate having a first material thereover;

forming a beam of activated particles proximate the first material;

forming a second material with the beam of activated particles;

displacing the beam relative to the first material to form a pattern of the second material across the first material; and etching the first material while using the second material as an etch mask.

41. The method of claim 40 wherein the first material is an electrically insulative material.

42. The method of claim 40 wherein the first material is a semiconductive material.

43. The method of claim 40 wherein the first material is an electrically conductive material.

44. The method of claim 40 wherein the activated particles comprise activated carbon particles, and wherein the second material predominately comprises carbon from the activated carbon particles.

45. The method of claim 40 further comprising flowing a precursor of the second material across the first material and exposing the precursor to the activated particles; the forming the second material comprising impacting the precursor with the activated particles to cause the second material to be deposited from the precursor.

46. The method of claim 45 wherein the precursor comprises a material consisting of hydrogen and carbon.

47. The method of claim 45 wherein the precursor comprises a material consisting of hydrogen and carbon; and wherein the activated particles consist essentially of gallium ions.

48. A method of forming a patterned material on a semiconductor substrate, comprising:

providing a semiconductor substrate having a first material thereover, and defining a first region and defined second region of the first material;

forming a beam of activated particles proximate the first material;

forming a second material with the beam of activated particles;

displacing the beam relative to the first material to form a pattern of the second material across at least some of the first region of the first material, the pattern of the second material not being across the second region of the first material;

forming photoresist across the second region of the first material;

photolithographically patterning the photoresist to form a patterned mask of the photoresist over the second region;

etching within the first region of the first material while using the second material as an etch mask; and etching within the second region of the first material while using the patterned mask of photoresist as an etch mask.

49. The method of claim 48 wherein the activated particles comprise activated carbon particles, and wherein the second material predominately comprises carbon from the activated carbon particles.

50. The method of claim 48 wherein the etching within the first region occurs simultaneously with the etching within the second region.

51. The method of claim 48 wherein the etching within the first region occurs before the etching within the second region.

52. The method of claim 48 wherein the etching within the first region occurs after the etching within the second region.

53. The method of claim 48 further comprising flowing a precursor of the second material across the first material and exposing the precursor to the activated particles; the forming the second material comprising impacting the precursor with the activated particles to cause the second material to be deposited from the precursor.

54. The method of claim 53 wherein the precursor comprises a material consisting of hydrogen and carbon.

55. The method of claim 53 wherein the precursor comprises a material consisting of hydrogen and carbon; and wherein the activated particles consist essentially of gallium ions.

* * * * *